US012610567B2

(12) United States Patent
Buffle et al.

(10) Patent No.: US 12,610,567 B2
(45) Date of Patent: Apr. 21, 2026

(54) ELECTRICAL DEVICE FOR HIGH-VOLTAGE APPLICATIONS

(71) Applicant: Murata Manufacturing Co., Ltd., Nagaokakyo (JP)

(72) Inventors: Larry Buffle, Grenoble (FR); Frédéric Voiron, Barraux (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 380 days.

(21) Appl. No.: 18/508,633

(22) Filed: Nov. 14, 2023

(65) Prior Publication Data

US 2024/0162280 A1      May 16, 2024

(30) Foreign Application Priority Data

Nov. 14, 2022    (EP) ..................................... 22315286

(51) Int. Cl.
*H10D 1/68*          (2025.01)
*H10D 1/00*          (2025.01)
(52) U.S. Cl.
CPC ............. *H10D 1/696* (2025.01); *H10D 1/042* (2025.01); *H10D 1/043* (2025.01); *H10D 1/716* (2025.01)
(58) Field of Classification Search
CPC ............................... H10D 1/696; H10D 1/716
See application file for complete search history.

(56) References Cited

U.S. PATENT DOCUMENTS

| | | | |
|---|---|---|---|
| 6,001,684 A | 12/1999 | Shen | |
| 11,145,711 B2 | 10/2021 | Ashimine et al. | |
| 2005/0170582 A1 | 8/2005 | Furuhata et al. | |
| 2008/0076230 A1 | 3/2008 | Cheng et al. | |
| 2010/0213572 A1* | 8/2010 | Ching ................. | H01L 23/5223 257/532 |
| 2019/0326449 A1* | 10/2019 | Erlbacher ......... | H01L 21/02197 |

FOREIGN PATENT DOCUMENTS

EP            3588560 A1      1/2020

* cited by examiner

*Primary Examiner* — Douglas M Menz
(74) *Attorney, Agent, or Firm* — ArentFox Schiff LLP

(57) ABSTRACT

An electrical device for high-voltage applications and a method for obtaining an electrical device. The electrical device includes a capacitor having: a bottom electrode having a conductive structure, the conductive structure including a base surface and facing protruding walls extending upwards and having a highest surface; a top electrode having at least one conductive region arranged between the facing protruding walls and having a top surface, wherein the top surface of the at least one conductive region lies below or at the level of the highest surface of the protruding walls; and a dielectric region extending conformally over the bottom electrode and surrounding the top electrode, the capacitor being formed by the bottom and top electrodes separated by the dielectric region.

15 Claims, 10 Drawing Sheets

Electrical device 100

Electrical device 200
(outside of the scope of
the invention)

150

110

111          111          111          111

131

132

110

111          111          111          111

131
132
120
110

111    121    111    121    111    121    111

130
133
131
132
120
110

111    121    111    121    111    121    111

100

100

111

111

112

112

ELECTRICAL DEVICE FOR HIGH-VOLTAGE APPLICATIONS

CROSS REFERENCE TO RELATED APPLICATIONS

The present application claims priority to European Patent Application No. EP22315286, filed Nov. 14, 2022, the entire contents of which are incorporated herein by reference.

FIELD OF THE INVENTION

The present invention relates to the field of electrical devices, and more precisely to capacitive devices used in high voltage applications.

DESCRIPTION OF RELATED ART

Electronic components, such as capacitors, with three-dimensional (3D) capacitive structures have been developed in view of providing high energy storage density. Typically, 3D capacitive structures are formed conformally on reliefs such as pores, holes, trenches, or pillars, which allows providing a large specific area for a given component size.

Still, electrical components with 3D structures cannot be directly transposed to high voltage applications (e.g. exceeding 900V, or 1.2 kV) without considering the specific features and constraints of these applications. In fact, the presence of geometrical singularities (e.g. corners, edges) in a 3D capacitive structure leads to a local increase of the electrostatic field, in particular when the thickness of the dielectric is of the order of the size of the singularity. The local increase in the electrostatic field contributes to increasing the leakage current within the capacitive structure. More generally, this issue negatively impacts the robustness of the electrical component and requires limiting the operating voltage to guarantee a desired lifetime of the component.

To mitigate local increases of the electrostatic field in 3D capacitive structures, it has been proposed in Voiron et al. (EP 3588560 A1) to use a 3D structure with rounded corners (illustrated by FIG. 1). More precisely, the curvature radius of the rounded corners is set to be greater than the thickness of the dielectric, and preferably twice the thickness. Rounding the corners of the 3D structure results in a more uniform distribution of the electrostatic field and enables to better withstand the operating electrostatic field of high voltage applications.

However, the aforementioned solution of Voiron et al. could be further improved to increase the storage density of the electrical component. For example, considering a 3D capacitive structure with protruding walls, rounding the corners of the protruding walls with a large curvature radius requires the use of thick protruding walls, which inevitably limits the number of walls within the component. It follows that the specific area that contributes to the capacitance of the capacitive structure is limited, as is its energy storage density. In addition, the specific area is even further limited since thick dielectrics (e.g. thickness >1.5 μm) are required meet the high breakdown voltage requirement of high voltage applications.

Therefore, there exists a need for an electrical device with high energy storage density suited for high voltage applications.

The present invention has been made in the light of the above problems.

SUMMARY OF THE INVENTION

According to a first aspect, the present invention provides an electrical device comprising a capacitor including: a bottom electrode comprising a conductive structure, the conductive structure comprising a base surface and facing protruding walls extending upwards from the base surface and having a highest surface; a top electrode comprising at least one conductive region arranged between the facing protruding walls and having a top surface (i.e. the surface on top of the top electrode), wherein the top surface of said at least one conductive region lies below or at the level of the highest surface of the protruding walls; and a dielectric region extending conformally over the bottom electrode (for example, it conforms to the contours of the bottom electrode) and surrounding the top electrode (for example it is below, on the sides, and above the top electrode), said capacitor being formed by the bottom and top electrodes separated by the dielectric region.

In the proposed device, there is no top electrode above the peaks of the bottom electrode (i.e. above the highest surface of the facing protruding walls, the surface that lies at the highest position). This leads the electrostatic field to only extend between the vertical portions and the bottom portions (i.e. side and bottom surfaces) of the facing top and bottom electrodes. Thus, the magnitude of the electrostatic field is significantly reduced in the vicinity of the peaks of the bottom electrode (i.e. geometrical singularities in the capacitive structure).

The present invention allows reducing the magnitude of the electrostatic field in the vicinity of geometrical singularities (e.g. corners, edges, etc.) of a 3D capacitive structure. To this purpose, the present invention proposes allowing using a large thickness of dielectric near singularities, by: lowering the top electrode (comprising the conductive region) below the peaks of the bottom electrode (comprising the protruding walls); and forming a dielectric region between and above the electrodes.

The proposed solution allows reducing the electrical stress within a 3D capacitive structure and enables better withstanding the operating electrostatic field of high-voltage applications. Improved performance in terms of breakdown voltage, leakage current, dielectric rigidity, device reliability and lifetime follows as a result.

In comparison to the aforementioned solution of Voiron et al., the present invention makes the use of rounded corners less stringent (i.e. smaller curvature radius can be used) or even unnecessary. Accordingly, thinner protruding walls can be used to form trenches which results in an increased number of trenches within the electrical device. Thereby, the present invention allows increasing the storage density of an electrical device.

For these reasons, the present invention provides an electrical device with high capacitance density suited for high-voltage applications (e.g. exceeding 900V, or 1.2 kV).

The protruding walls may present: a (substantially) linear shape (e.g. over a given length); or a curved shape. In the latter case, the curvature radius of curved protruding walls may be greater than twice a thickness of the dielectric region to prevent local increases of the electrostatic field in the capacitor.

In a particular embodiment, the facing protruding walls of the conductive structure form one or more trenches. For instance, the protruding walls can form a plurality of separate adjacent trenches or a trench extending in a meander-shape.

In a particular embodiment, the dielectric region comprises: a bottom dielectric layer extending conformally over the protruding walls, said at least one conductive region being arranged on the bottom dielectric layer; and a top dielectric layer on the bottom dielectric layer and on the top surface of said at least one conductive region.

To further illustrate this embodiment, we consider a plane perpendicular to the base surface of the bottom electrode. In this plane, the bottom dielectric layer separates the bottom and top electrodes and the top dielectric layer extends above the bottom and top electrodes.

More specifically, in this plane, the conductive region (of the top electrode) is encapsulated by the bottom and top dielectric layers. The conductive structure (of the bottom electrode) is covered by the bottom dielectric layer (extending conformally on the protruding walls), and the highest surface (i.e. the peaks, the top) of the conductive structure is covered by the stack of the bottom and top dielectric layers.

In this embodiment, the electrical device can be obtained by depositing the top electrode with any deposition technique, followed by an etching step that allows trimming the top electrode selectively compared to the dielectric region so that the top surface of the top electrode lies below the highest surface of the bottom electrode. Therefore, this embodiment is advantageous in that it is particularly easy to implement on various equipment.

In a particular embodiment, the bottom dielectric layer comprises: an oxide sub-layer on the conductive structure (for example, an oxide of the conductive structure); and a dielectric sub-layer on the oxide sub-layer, the permittivity of the dielectric sub-layer being different from the permittivity of the oxide sub-layer.

In this embodiment, the bottom and top electrodes (respectively comprising the conductive structure and the conductive region) are separated by the oxide sub-layer and the dielectric sub-layer. In particular, the oxide sub-layer may be formed by oxidation of the conductive structure (it is an oxide of the material of the bottom electrode).

By using a bi-layer dielectric structure, this embodiment allows providing a dielectric region with strong adherence to the conductive structure and a tunable permittivity.

In a particular embodiment, the permittivity of the dielectric sub-layer is greater than the permittivity of the oxide sub-layer (e.g. the dielectric sub-layer is a high-K material).

This embodiment allows providing a dielectric region with strong adherence to the conductive structure and a high permittivity.

In a particular embodiment, the dielectric region comprises: an outer dielectric structure surrounding said at least one conductive region (typically in a plane perpendicular to the base surface) and comprising: a bottom dielectric sub-layer extending conformally over the protruding walls; and a ceiling dielectric sub-layer, said at least one conductive region being arranged inside a region defined by the bottom and ceiling dielectric sub-layers (typically in a plane perpendicular to the base surface); and a top dielectric layer on and above the outer dielectric structure.

To further illustrate this embodiment, we consider a plane perpendicular to the base surface of the bottom electrode. In this plane, the outer dielectric structure separates the bottom and top electrodes, and the top dielectric layer extends above the bottom and top electrodes.

More specifically, in this plane, a conductive region (of the top electrode) is encapsulated by the outer dielectric structure (formed by the bottom dielectric and ceiling sub-layers). The conductive structure (of the bottom electrode) is covered by the bottom dielectric sub-layer (extending conformally on the protruding walls), and the highest surface of the conductive structure is covered by the stack of the bottom dielectric sub-layer and the top dielectric layer.

In particular, this embodiment is advantageous as the conductive region is in contact only with the inner dielectric sub-layer (e.g. a high-K material). As detailed hereinafter, this embodiment allows reducing the magnitude of the electrostatic field within the capacitive structure and, more particularly, reducing the concentration of the electrostatic field in the vicinity of the geometrical singularities (corners, edges) of the top electrode (comprising the conductive regions).

In addition, this embodiment is advantageous in that the electrical device can be obtained with fewer manufacturing steps.

In a particular embodiment, the bottom dielectric sub-layer is an oxide sub-layer on the conductive structure, and an inner dielectric sub-layer is arranged between the outer dielectric structure and said at least one conductive region, the permittivity of the inner dielectric sub-layer being different from the permittivity of the bottom dielectric sub-layer.

In this embodiment, the bottom and top electrodes (respectively comprising the conductive structure and the conductive region) are separated by the inner dielectric sub-layer and the bottom dielectric sub-layer. In particular, the bottom dielectric sub-layer may be formed by oxidation of the conductive structure (it is an oxide of the material of the bottom electrode).

To illustrate this embodiment, we consider a plane perpendicular to the base surface of the conductive structure. In this plane, the conductive region is encapsulated by (and in contact with) the inner dielectric sub-layer; and the inner dielectric sub-layer is encapsulated by (and in contact with) the outer dielectric structure.

This embodiment allows providing a dielectric region with strong adherence to the conductive structure and a tunable permittivity.

In a particular embodiment, the permittivity of the inner dielectric sub-layer is greater than the permittivity of the oxide sub-layer (e.g. the inner sub-layer is a high-K material).

This embodiment allows providing a dielectric region with strong adherence to the conductive structure and a high permittivity.

In a particular embodiment, the dielectric region comprises a hole opening onto a portion of said at least one conductive region, said hole being filled with a conductive material so as to form a contact (i.e. an electrical contact) with said at least one conductive region.

This embodiment allows providing a contact port to a conductive region (of the top electrode) while maintaining a low magnitude electrostatic field within the 3D capacitive structure.

In a particular embodiment, a distance between facing protruding walls at the level of the hole opening onto the portion of said at least one conductive region is larger than a distance between facing protruding walls at the level of another portion of said at least one conductive region surrounded by the dielectric region.

This embodiment allows maintaining a low magnitude electrostatic field within the capacitive structure, in particular near the contact port, while providing a high energy storage density.

By means of illustration of this embodiment, we consider protruding walls forming trenches. In this context, and according to this embodiment, the portion of a trench comprising the contact port is widened with regards to the remaining portion of the trench.

By widening the trench around the contact port, this embodiment allows using a large thickness of dielectric in this area (i.e. around the hole filled with conductive material). This embodiment hence allows maintaining a low magnitude electrostatic field around the contact port.

In addition, since only the portion of the trench comprising the contact port is widened, the remaining portion of the trench may be kept narrow. As a result, this embodiment allows using a large number of trenches within the electrical device.

In a particular embodiment, a length of the portion of said at least one conductive region at the level of the hole is smaller than a length of said another portion of said at least one conductive region surrounded by the dielectric region.

In a particular embodiment, the capacitor comprises a plurality of conductive regions interconnected with each other to form the top electrode. Accordingly, in a particular embodiment, the dielectric region comprises holes respectively opening onto portions of the conductive regions.

This embodiment is advantageous as it allows using a large thickness of dielectric between the conductive structure (of the bottom electrode) and the electrical connections (e.g. formed by a metal layer) of the conductive regions (of the top electrode). This embodiment thereby allows maintaining a low magnitude electrostatic field within the 3D capacitive structure. Further, this embodiment allows providing an electrical device with a high capacitance value.

In a particular embodiment, corners (e.g. bottom corners, top corners) of protruding walls are rounded.

Rounding the corners of the protruding walls results in a more uniform distribution of the electrostatic field. Thereby, this embodiment allows further reducing the magnitude of the electrostatic field in the vicinity of these geometrical singularities of the 3D capacitive structure.

In a particular embodiment, a curvature radius of said rounded corners is less than a thickness of the dielectric region.

This embodiment allows providing a 3D capacitive structure with a high capacitance density while maintaining a low magnitude electrostatic field in the vicinity of singularities.

It is worth mentioning that the aforementioned solution of Voiron et al. proposes using a curvature radius of twice the thickness of the dielectric, which requires using thick protruding walls. In contrast, in the context of protruding walls forming trenches, this embodiment allows using thinner protruding walls to form the trenches which results in an increased number of trenches within the device.

In a particular embodiment, the conductive structure comprises first protruding walls extending along a first direction and second protruding walls extending along a second direction, wherein the second direction differs from the first direction.

This embodiment allows reducing the mechanical stress within the integrated energy storage component.

In a particular embodiment, the first and second directions form a defined angle. In a particular embodiment, the first and second directions are substantially perpendicular.

In a particular embodiment, the electrical device is used with an operating voltage measured between the bottom and top electrodes exceeding 900V or 1200V. For instance, the proposed electrical device may be used as a decoupling or snubber capacitive element for power electronic.

According to a second aspect, the invention provides a method for obtaining an electrical device comprising a capacitor, said method comprising:

forming a conductive structure so as to obtain a bottom electrode, the conductive structure comprising a base surface and facing protruding walls extending upwards from the base surface and having a highest surface;

forming at least one conductive region so as to obtain a top electrode, said at least one conductive region being arranged between the facing protruding walls and having a top surface, wherein the top surface of said at least one conductive region lies below or at the level of the highest surface of the protruding walls; and forming a dielectric region extending conformally over the protruding walls and surrounding said at least one conductive region.

The proposed method can be adapted to obtain any one of the electrical devices defined in the present disclosure. Further, it should be noted that the embodiments of the proposed method for obtaining an electrical device present the advantages described above in relation with the embodiments of the proposed electrical device.

In a particular embodiment, forming the dielectric region comprises: forming a bottom dielectric layer extending conformally over the protruding walls, said at least one conductive region being formed on the bottom dielectric layer; and forming a top dielectric layer on the bottom dielectric layer and on the top surface of said at least one conductive region.

In a particular embodiment, forming the bottom dielectric layer comprises: oxidizing the conductive structure so as to obtain an oxide sub-layer; and depositing a dielectric sub-layer on the oxide sub-layer, the permittivity of the dielectric sub-layer being different from the permittivity of the oxide sub-layer.

In a particular embodiment, forming the dielectric region comprises: forming an outer dielectric structure comprising: a bottom dielectric sub-layer extending conformally over the protruding walls; and a ceiling dielectric sub-layer; and forming a top dielectric layer on and above the outer dielectric structure, wherein the outer dielectric structure surrounds said at least one conductive region, said at least one conductive region being arranged inside a region defined by the bottom and ceiling dielectric sub-layers.

In a particular embodiment, the bottom dielectric sub-layer is formed by oxidation of the conductive structure, and said method comprises: depositing an inner dielectric sub-layer so as to line inner surfaces of the region defined by the bottom and ceiling dielectric sub-layers, the permittivity of the inner dielectric sub-layer being different from the permittivity of the bottom dielectric sub-layer.

In a particular embodiment, the method comprises: etching the dielectric region so as to obtain a hole opening onto a portion of said at least one conductive region; and filling said hole with a conductive material so as to form a contact with said at least one conductive region.

In a particular embodiment, said method comprises rounding corners of protruding walls, a curvature radius of said rounded corners being less than a thickness of the dielectric region.

In a particular embodiment, said method comprises interconnecting a plurality of conductive regions so as to form the top electrode.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF EXAMPLE EMBODIMENTS

Embodiments of the present invention provide an electrical device with a high energy storage density suited for high-voltage applications. More specifically, embodiments of the present invention seek to reduce local concentrations of electrostatic field in a 3D capacitive structure.

The present invention is, in particular, relevant in the context of electrical devices using 3D capacitive structures with trenches or at least facing walls. The following description of the invention will refer to this particular context, which is only given as an illustrative example and should not limit the invention as the invention also applies to 3D capacitive structures based on pores, pillars, or holes.

Figure 1:
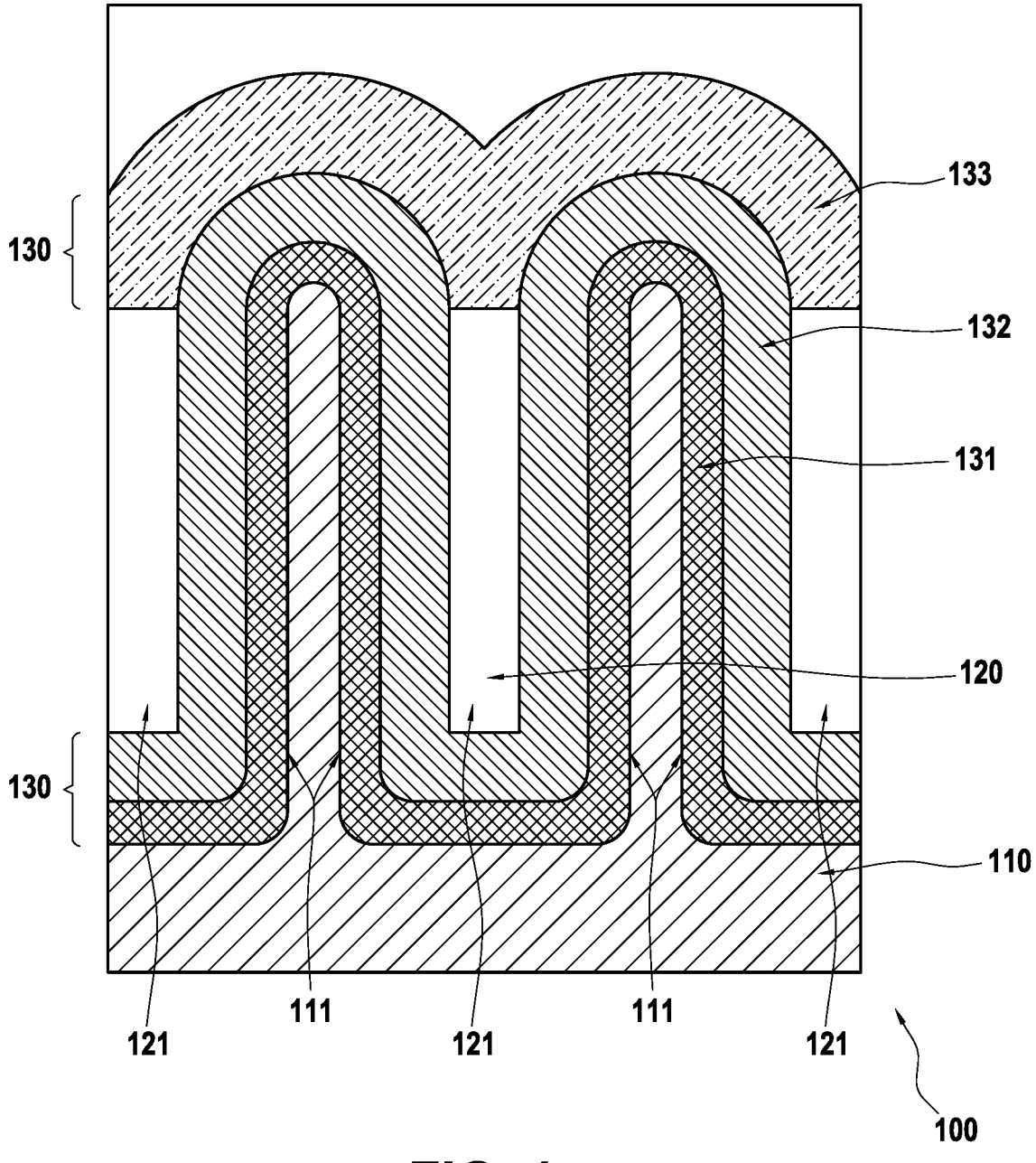
FIG. 1 illustrates a side cross-section view of an electrical device according to embodiments of the invention.

FIG. 1 illustrates a side cross-section view of an electrical device according to embodiments of the invention.

The electrical device 100 comprises a capacitor formed by a bottom electrode 110 and a top electrode 120 separated by a dielectric region 130.

The bottom electrode 110 comprises a conductive structure with facing protruding walls 111 extending upwards from the base surface of the conductive structure 110. The conductive structure 110 may be formed by etching a semiconductor substrate (e.g. a doped silicon substrate). Further, the conductive structure 110 may also be formed by a substrate (e.g. a substrate comprising glass or a polymer material) covered by a conductive layer.

The protruding walls 111 can extend in a (substantially) linear or curved manner. In other words, the protruding walls 111 may present: a (substantially) linear shape (e.g. over a given distance, for instance the same distance for a group of parallel walls); or a curved shape. In the latter case, to prevent local increases of the electrostatic field in the capacitor, the curvature radius of curved protruding walls 111 may be greater than twice a thickness of the dielectric region 130 (e.g. the thickness of the dielectric between the electrodes).

In a particular embodiment, the facing protruding walls 111 form one or more trenches. For example, the protruding walls 111 form a plurality of separate adjacent trenches or a trench extending in a meander-shape.

As illustrated in FIG. 1, the corners of the protruding walls 111 can be rounded with a curvature radius smaller than the thickness of the dielectric region 130.

The top electrode 120 comprises conductive regions 121 respectively arranged between facing protruding walls 111. The top surface of the conductive regions 121 lies below or at the level of the highest surface (i.e. the peaks, the top) of the protruding walls 111.

Specifically, the highest point of the top surface of the conductive regions 121 lies below or at the same level of the lowest point of the highest surface (i.e. the peaks, the top) of the protruding walls 111. For instance, the top surface of the conductive regions 121 may be one or few $\mu m$ below the highest surface of the protruding walls 111. In particular, the top surface of the conductive regions 121 may be below the rounded portion of the protruding walls 111.

In an embodiment, the top electrode 120 comprises a plurality of conductive regions 121 electrically interconnected with each other (by back-end interconnections).

The dielectric region 130 separates the bottom electrode 110 (comprising the protruding walls 111) and the top electrode 120 (comprising the conductive regions 121). In particular, the dielectric region 130 extends conformally over the protruding walls 111 and surrounds the conductive regions 121.

In the embodiment illustrated in FIG. 1, the dielectric region 130 comprises: a bottom dielectric layer 131-132 extending conformally over the protruding walls 111; and a top dielectric layer 133 extending on the conductive regions 121 and on the bottom dielectric layer 131-132.

The bottom dielectric layer 131-132, here, comprises: an oxide sub-layer 131; and a dielectric sub-layer 132 arranged on the oxide sub-layer 131. In this embodiment, the oxide sub-layer 131 covers (in contact) the conductive structure 110; and, the dielectric sub-layer 132 covers (in contact) the bottom and side surfaces of the conductive regions 121. Preferably, the permittivity of the dielectric sub-layer 132 is greater than the permittivity of the oxide sub-layer 131. This bi-layer structure 131, 132 is advantageous as the obtained dielectric region 130 presents a strong adherence to the conductive structure 110 and a high permittivity. For instance, the oxide sub-layer 131 may comprise silicon oxide ($SiO_2$) and may be 1 $\mu m$ or 2 $\mu m$ thick. The dielectric sub-layer 132 may comprise silicon nitride ($Si_3N_4$) or aluminum oxide ($Al_2O_3$) and may be 1 $\mu m$ or 2 $\mu m$ thick.

Within the scope of the invention, it could also be contemplated embodiments wherein the bottom dielectric layer 131-132 comprises more than two dielectric sub-layers.

The top dielectric layer 133 extends, in this embodiment, on the bottom dielectric layer 131-132 and on the conductive regions 121. Specifically, the top dielectric layer 133 covers (in contact) the top surface of the conductive regions 121.

As can be observed on FIG. 1, the conductive regions 121 of the top electrode 120 are surrounded, at least on the cross-section visible on the figure, by the bottom 131-132 and top 133 dielectric layers.

For example, the top dielectric layer 133 may comprise silicon oxide ($SiO_2$) and may be 1 $\mu m$ or 2 $\mu m$ thick. The top dielectric layer 133 is also referred to hereafter as the "passivation dielectric layer" as it prevents the increase of the electrical field near the geometrical singularities of the capacitive structure. Furthermore, the passivation dielectric layer 133 allows reducing the coupling between the electrodes 110,120 and the back-end interconnections.

Within the scope of the invention, it could also be contemplated embodiments wherein the top dielectric layer 133 comprises a plurality of dielectric sub-layers.

Figures 2, 3A:
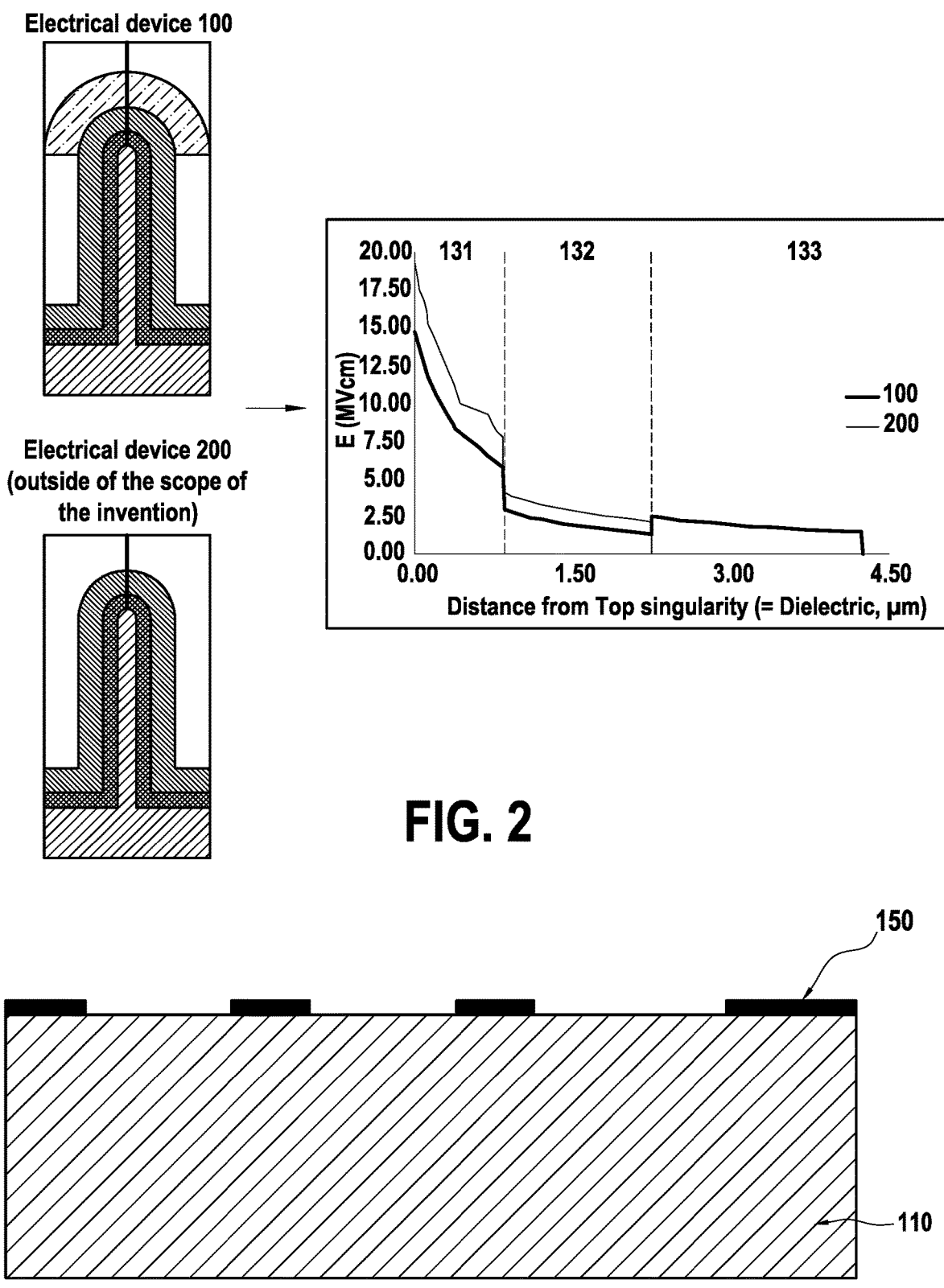
FIG. 2 illustrates a distribution of the electrostatic field magnitude within an electrical device according to embodiments of the invention.
FIG. 3A-3F illustrate the steps of a method for obtaining an electrical device according to embodiments of the invention and a side cross-section view of the electrical device.

FIG. 2 illustrates a distribution of the electrostatic field magnitude within an electrical device according to embodiments of the invention.

Specifically, FIG. 2 represents the electrostatic field within the electrical device 100 according to the embodiment illustrated by FIG. 1. For comparison purposes, FIG. 2 also represents the electrostatic field within another electrical device 200 that corresponds to the device of FIG. 1 except in that it does not include a passivation dielectric layer 133 and, hence, lies outside of the scope of the invention.

It is worth reminding that the electrostatic field magnitude at a given point of a capacitive structure is directly related to the local difference of charge density between the opposite electrodes. As such, where the electrode geometry is uniform, the electrostatic field is evenly distributed. However, when the electrode geometry presents a singular point (e.g. a corner) the difference of length/surface between the opposite electrodes at the singular point induces a difference of charged density near the singular point. As a consequence, the electrostatic field is locally increased in the vicinity of the singular point.

The plot of FIG. 2 represents the magnitude of the electrostatic field (y-axis) as a function of the distance from the highest surface (i.e. the peak, the top) of a protruding wall 111 (x-axis). In particular, the plot of FIG. 2 illustrates the magnitude of the electrostatic field through the different layers 131, 132, 133 of the dielectric region 130.

As shown on the plot of FIG. 2, the magnitude of the electrostatic field within the electrical device 100 is significantly reduced in comparison to the magnitude of the electrostatic field within the electrical device 200. Precisely, a reduction of 25% of the electrostatic field magnitude has been observed and is represented on the plot of FIG. 2. Numerical simulations have shown that this result is verified above protruding walls 111 and also in the whole capacitive structure.

The reduced magnitude of the electrostatic field in the proposed electrical device 100 is achieved by using a large thickness of dielectric near geometrical singularities. In particular, this is obtained by: lowering the top electrode 120 (comprising the conductive regions 121) in recess with respect to the bottom electrode 110 (comprising the protruding walls 111); and forming a passivation dielectric layer 133 above both electrodes 110 and 120.

Thereby, the proposed solution allows reducing the electrical stress within the 3D capacitive structure. Improved performance in terms of breakdown voltage, leakage current, dielectric rigidity, device reliability and lifetime follows as a result. In particular, the proposed solution enables to better withstand the operating electrostatic field of high-voltage applications and prevent early fails and/or premature wear out of the capacitor.

FIG. 3A-3F illustrate the steps of a method for obtaining an electrical device according to embodiments of the invention and a side cross-section view of the electrical device. According to some embodiments, the proposed method for obtaining the proposed electrical device comprises at least one of the following steps described in relation with these figures.

In particular, FIG. 3A-3F further detail the electrical device 100 previously introduced in relation with FIG. 1.

In FIG. 3A, a step is shown in which an etching mask 150 (e.g. a hard mask) is deposited on the structure 110 (e.g. a doped silicon substrate).

Figure 3B:
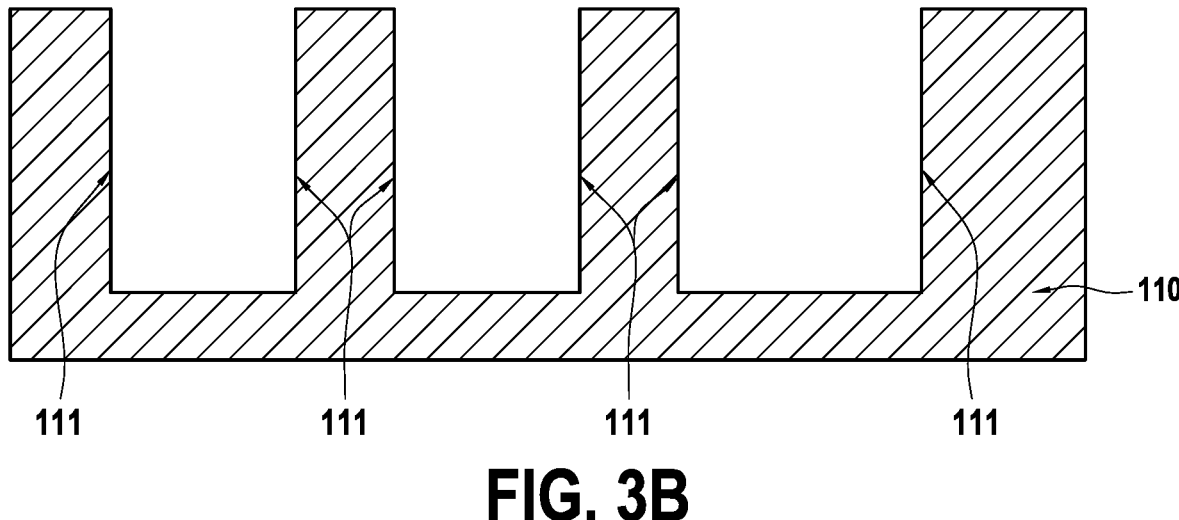

In FIG. 3B, a step is shown in which the structure 110 is etched using the etching mask 150 so as to obtain the facing protruding walls 111. For example, the structure 110 may be etched using dry anisotropic etching such as deep reactive ion etching. After etching the structure 110, the etching mask 150 may be removed using a selective etching.

As illustrated in FIG. 1, the corners of the protruding walls 111 can be rounded. Several approaches may be used to obtain rounded corners. For instance, isotropic dry etching may be used consume the sharp edges of the protruding walls 111. Furthermore, high temperature annealing of the silicon under low pressure hydrogen (e.g. 100 Torr, 1100° C.) may also be used to form rounded corners.

In a particular embodiment (not illustrated), especially in which the substrate is not conductive, a metal layer is deposited such that the conductive structure 110 is formed by an etched substrate comprising protruding walls 111 and a metal layer extending conformally over the etched substrate.

Figure 3C:
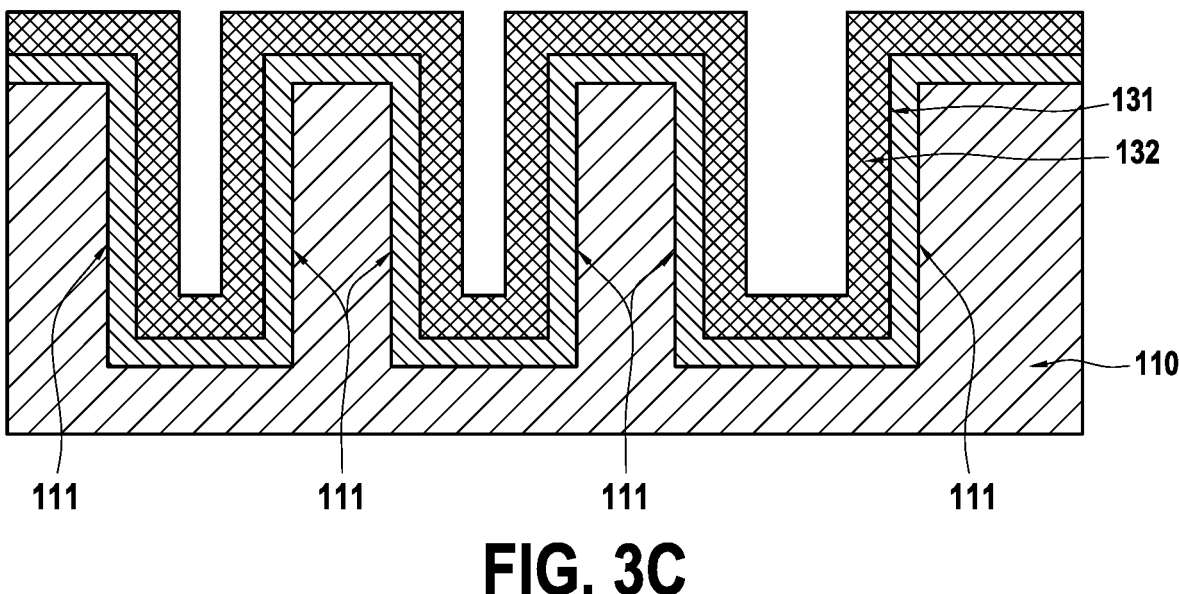

In FIG. 3C, a step is shown in which the bottom dielectric layer 131-132 is formed on the conductive structure 110. The bottom dielectric layer 131-132 extends conformally over the protruding walls 111.

Here, forming the bottom dielectric layer 131-132 comprises a step in which the oxide sub-layer 131 is formed by oxidizing the conductive structure 110. The oxide sub-layer 131 extends conformally over and covers the conductive structure 110.

Forming the bottom dielectric layer 131-132 further comprises a step in which the dielectric sub-layer 132 is formed on the conductive structure 110. The dielectric sub-layer 132 extends conformally over and covers the oxide sub-layer 131. For example, the dielectric sub-layer 132 may be formed using Low Pressure Chemical Vapor Deposition (LPCVD) or Atomic layer deposition (ALD).

Figure 3D:
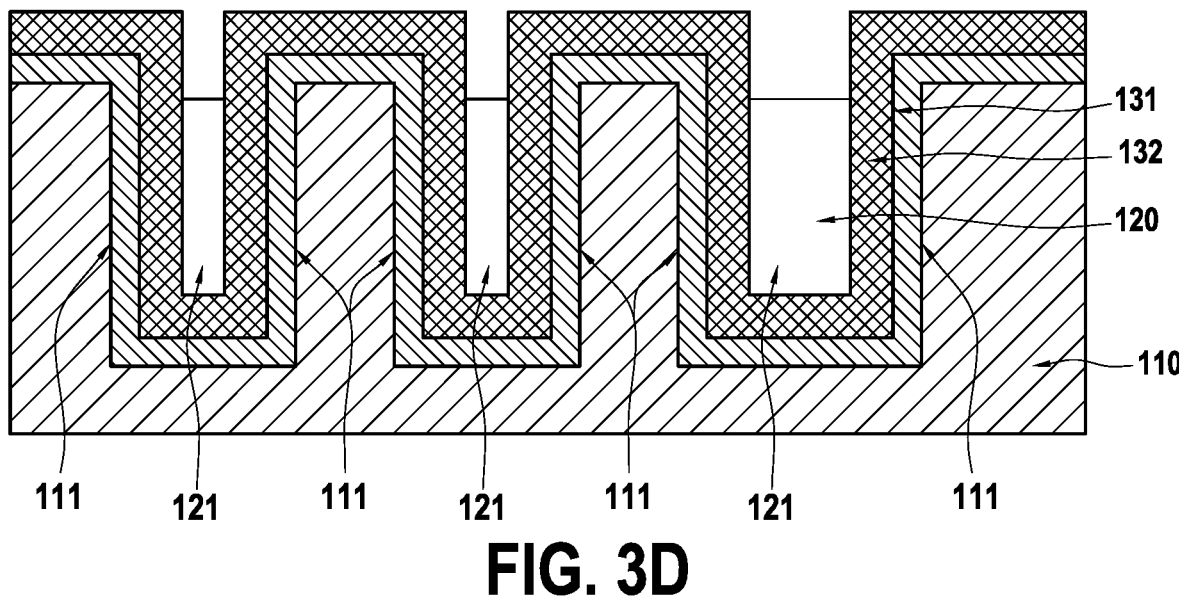

In FIG. 3D, a step is shown in which the conductive regions 121 are formed such that the top surface of the conductive regions 121 lies below or at the level of the highest surface (i.e. the peaks, the top) of the protruding walls 111.

In an embodiment, forming the conductive regions 121 comprises: depositing a conductive layer such that the top surface of the conductive layer lies above the top surface of the bottom dielectric layer 131-132; and etching the conductive layer so as to obtain the conductive regions 121 whose top surface lies below or at the level of the highest surface (i.e. the peaks, the top) of the protruding walls 111. This embodiment allows controlling the height of the conductive regions 121 of the top electrode 120.

The conductive regions 121 can be made of any conductive material compatible with deposition. For example, the conductive regions 121 may be formed of highly-doped polysilicon deposited by LPCVD.

As previously indicated, the top electrode 120 comprises in this embodiment a plurality of conductive regions 121 electrically interconnected with each other (by back-end interconnections) which is further detailed below in relation with FIG. 5.

Figure 3E:
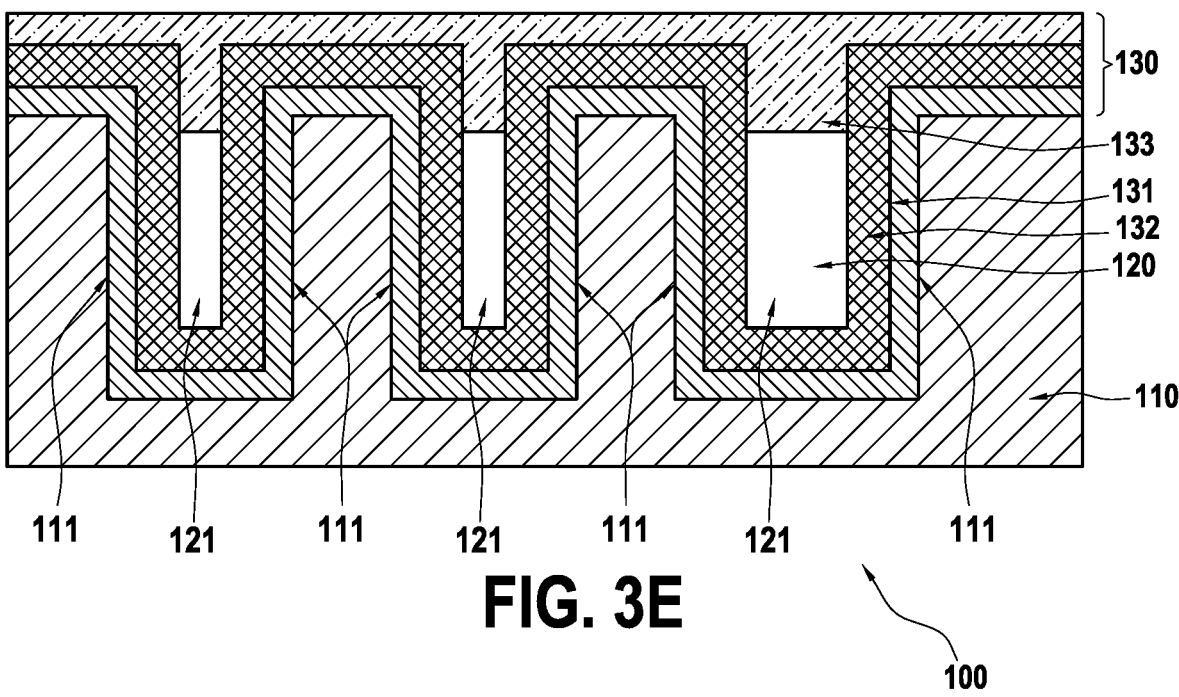

In FIG. 3E, a step is shown in which the top dielectric layer 133 is deposited such that the top surface of the top dielectric layer lies above the top surface of the bottom dielectric layer 131-132). In this embodiment, the top dielectric layer 133 (also referred to as the passivation dielectric layer) extends on the dielectric sub-layer 132 and on the conductive regions 121. For example, the top dielectric layer 133 comprises silicon oxide (SiO$_2$).

To further illustrate this embodiment, we consider a plane perpendicular to the base surface of the conductive structure 110. In this plane, the bottom surface of the conductive regions 121 is on (and in contact with) the dielectric sub-layer 132; the side surfaces of the conductive regions 121 are against (and in contact with) the dielectric sub-layer 132; and the top surface of the conductive regions 121 is covered (and in contact with) by the top dielectric layer 133.

At this stage, the electrical device 100 is obtained and includes a capacitor formed by the bottom 110 and top 120 electrodes separated by the dielectric region 130.

Figure 3F:
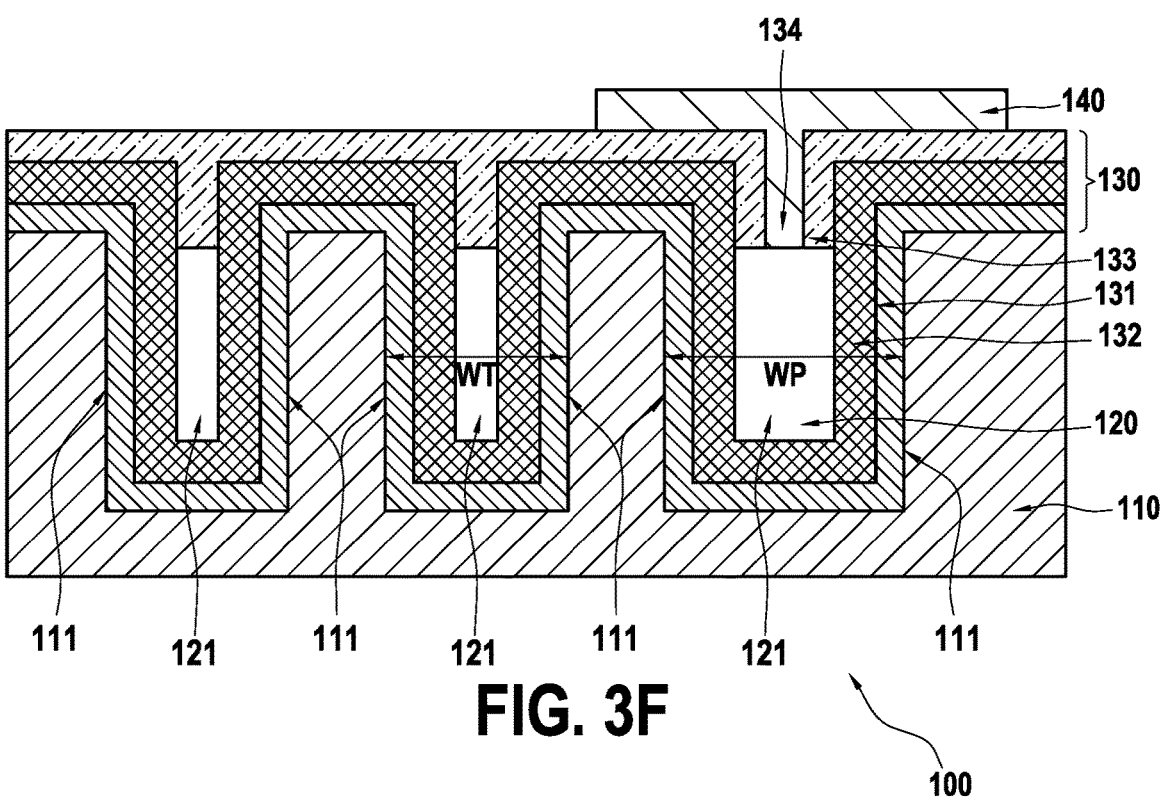

In FIG. 3F, a step is shown in which an electrical contact with a conductive region 121 is obtained. Embodiments wherein contact ports are provided in the electronic device 100 are further detailed below in relation with FIG. 5.

Specifically, forming the contact port with the conductive region 121 comprises: etching the top dielectric layer 133 so as to obtain a hole 134 opening onto a portion of the conductive region 121; and depositing a metal layer 140 so as to fill the hole 134.

The metal layer 140 interconnects a plurality of conductive regions 121 so as to form the top electrode 120.

As illustrated, the distance WP between facing protruding walls 111 at the level of the hole 134 (i.e. at the level of the contact port) opening onto a portion of the conductive region 121 is larger than the distance WT between facing protruding walls 111 at the level of another portion of said at least one conductive region 121 surrounded by the dielectric region 130.

FIG. 4A-4G illustrate the steps of a method for obtaining an electrical device according to embodiments of the invention and a side cross-section view of the electrical device 100'. According to some embodiments, the proposed method for obtaining the proposed electrical device 100' comprises at least one of the following steps described in relation with these figures.

Figure 4A:
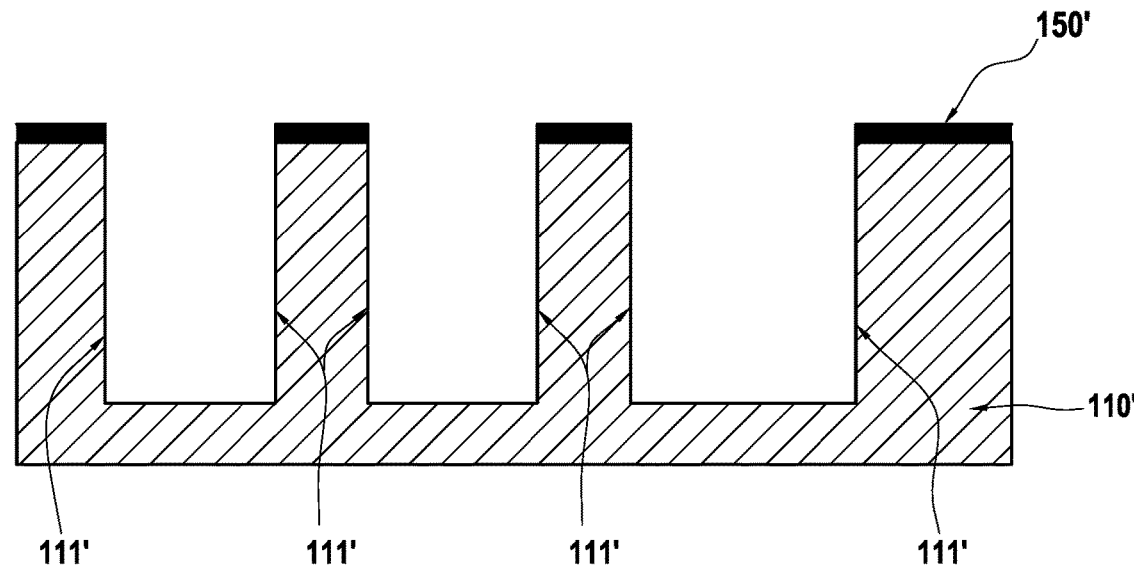
FIG. 4A-4G illustrate the steps of a method for obtaining an electrical device according to embodiments of the invention and a side cross-section view of the electrical device.

In FIG. 4A, a steps is shown in which the facing protruding walls 111' of the conductive structure 110' are formed using an etching mask 150'.

Specifically, forming the protruding walls 111' comprises: depositing the etching mask 150' on the conductive structure 110'; etching the conductive structure 110' so as to obtain the protruding walls 111'; and removing the etching mask 150'.

Figure 4B:
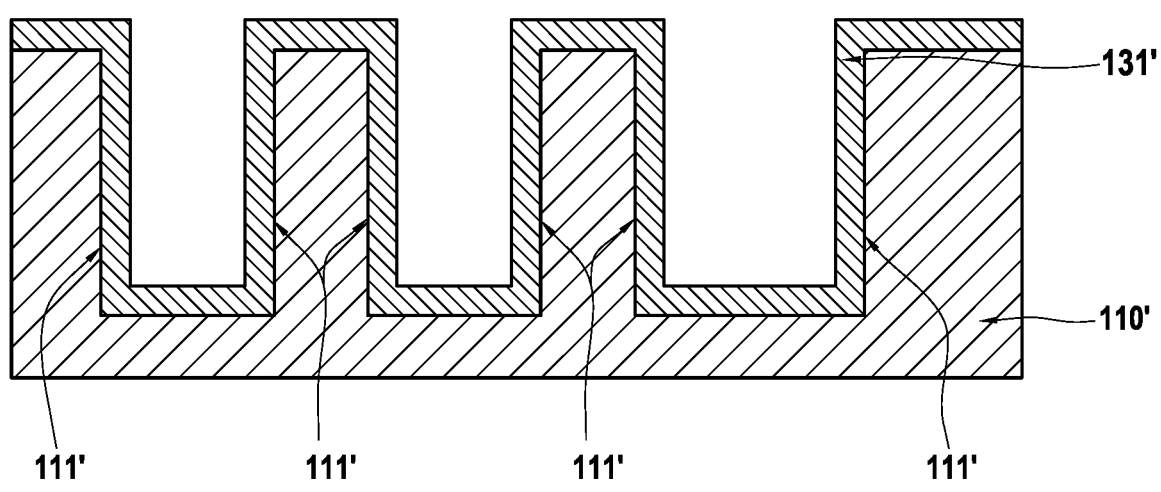

In FIG. 4B, a step is shown in which a bottom dielectric sub-layer 131' is formed on the conductive structure 110'. The bottom dielectric sub-layer 131' extends conformally over the protruding walls 111'. For example, the bottom dielectric sub-layer 131' may be formed by oxidation of the conductive structure 110'.

Figure 4C:
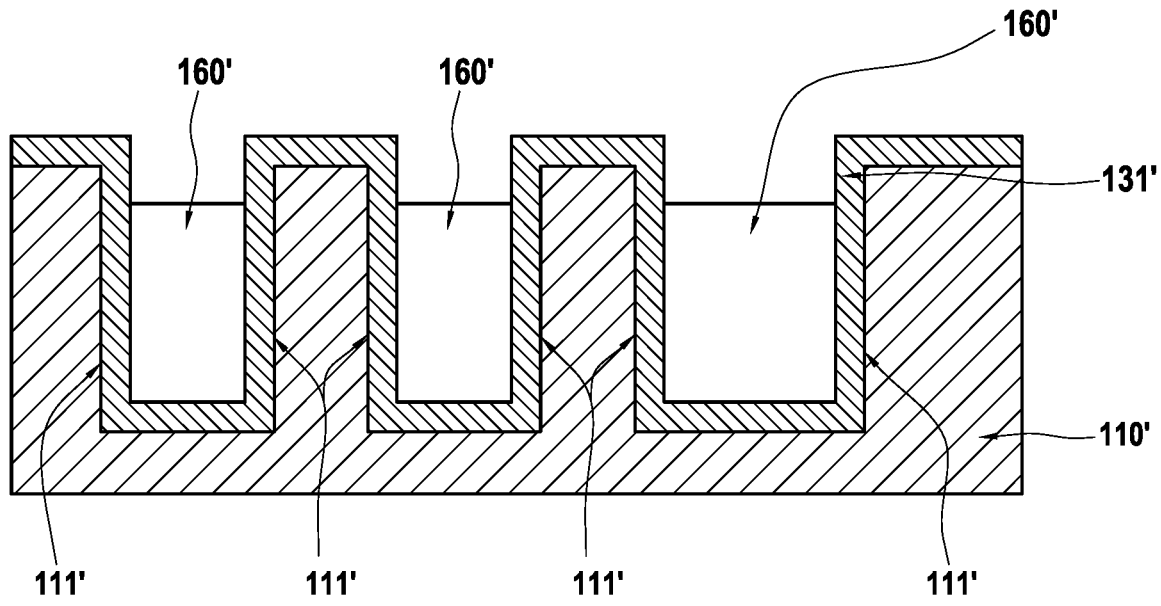

In FIG. 4C, a step is shown in which support material 160' is deposited on the bottom dielectric sub-layer 131' so as to partially the regions between facing protruding walls 111'. The top surface of the deposited support material 160' lies below or at the level of the highest surface (i.e. the peaks, the top) of the protruding walls 111'. The support material 160' can be selected so as to be easily etched using a highly selective etching (for example, with respect to the dielectric materials).

Figure 4D:
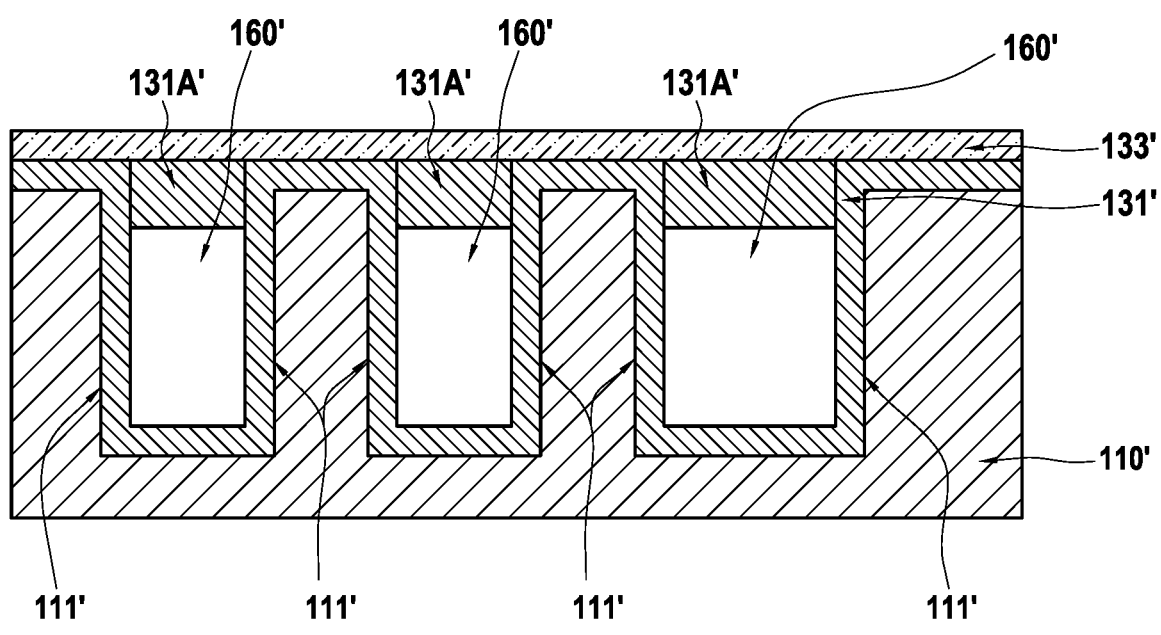

In FIG. 4D, a step is shown in which: a ceiling dielectric sub-layer 131A' is deposited on the support material 160' so as to form an outer dielectric structure 131'-131A'; and the top dielectric layer 133' is deposited on the outer dielectric structure 131'-131A'.

The outer dielectric structure 131'-131A', including the bottom dielectric sub-layer 131' and the ceiling dielectric sub-layers 131A', defines regions respectively comprised between facing protruding walls 111'.

Figure 4E:
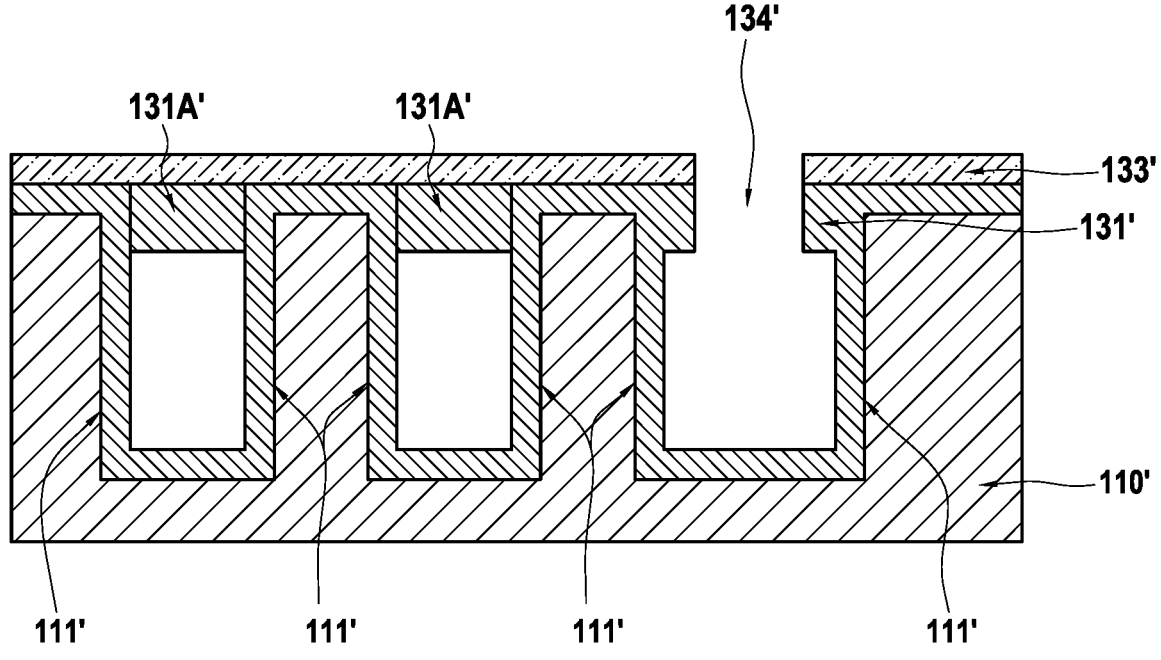

In FIG. 4E, a step is shown in which: the outer dielectric structure 131'-131A' and the top dielectric layer 133' are etched so as to obtain a hole 134' opening onto a portion of the support material 160'; and the support material 160' is etched. For example, the support material 160' may be removed using wet etching.

As illustrated on FIG. 4E, at this stage, the outer dielectric structure 131'-131A' is hollow and define cavities respectively arranged between facing protruding walls 111'.

Figure 4F:
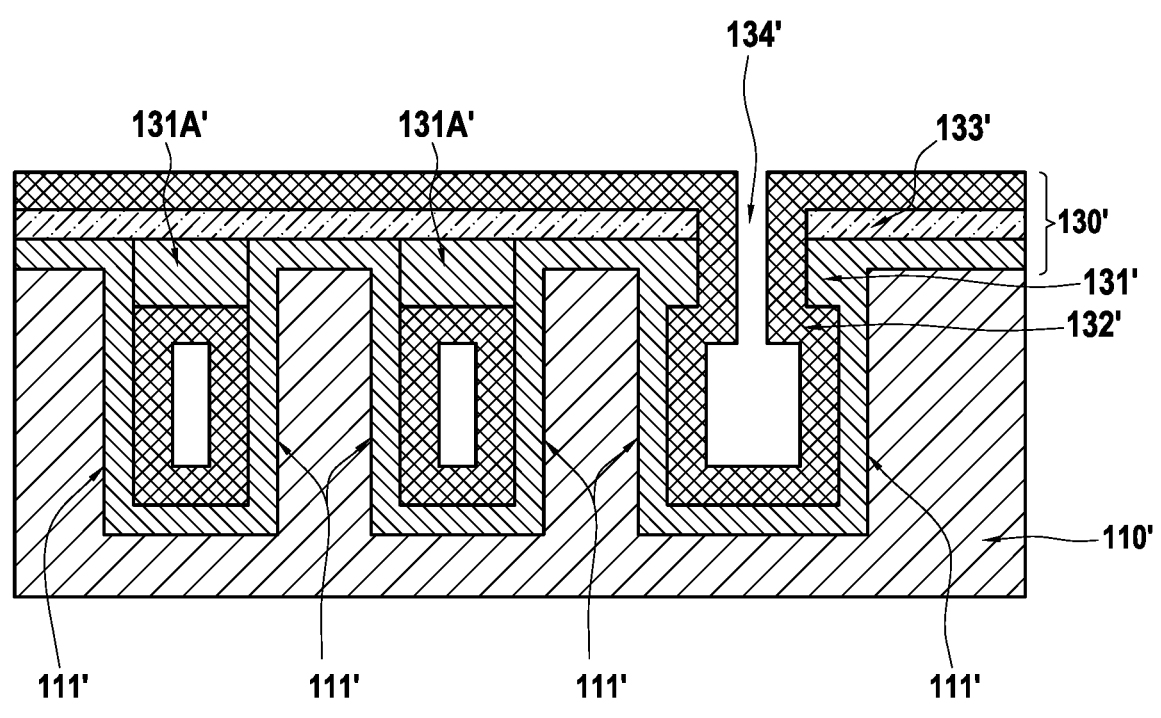

In FIG. 4F, a step is shown in which an inner dielectric sub-layer 132' is deposited. The inner dielectric sub-layer 132' is lining (coating) the inner surfaces of the cavities defined by the outer dielectric structures 131'-131A'. In addition, the inner dielectric sub-layer 132' extends on the top dielectric layer 133'. For example, the inner dielectric sub-layer 132' may be deposited using ALD that passes through the hole 134'.

Figure 4G:
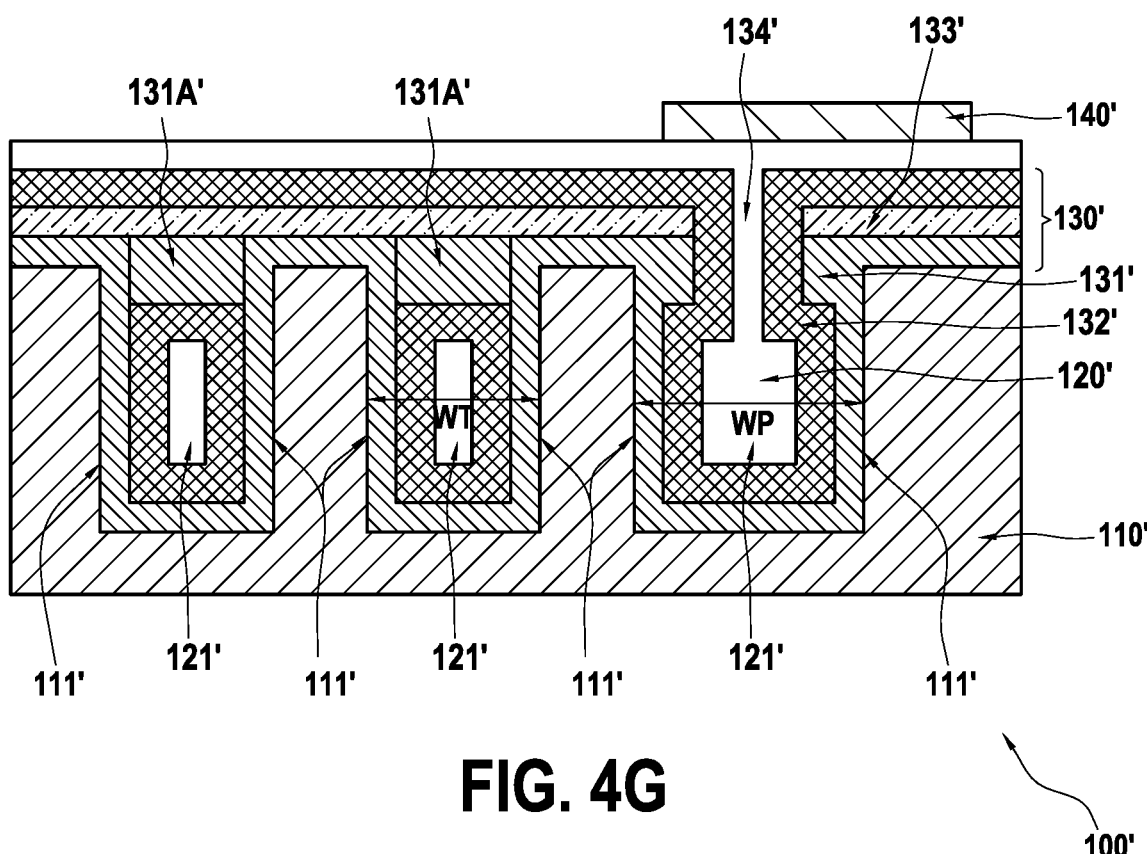

In FIG. 4G, a step is shown in which: a conductive layer is deposited on the inner dielectric sub-layer 132' so as to form the conductive regions 121'; and a metal layer 140' is deposited on the conductive layer.

In particular, the conductive layer is deposited so as to fill completely or partially the cavities defined by the outer dielectric structure 131'-131A' and the inner dielectric sub-layer 132'.

For example, the conductive regions 121' are respectively formed by depositing (for instance, using ALD) the conductive layer through a plurality of holes 134' so as to fill completely or partially the cavities arranged between facing protruding walls 111'. In other words, each conductive region 121' is formed by depositing the conductive layer through a hole 134' opening onto a cavity arranged between facing protruding walls 111'. Further, the structure of the hole 134', after depositing the inner dielectric sub-layer 132', may present a high aspect ratio (e.g. >1/50, or even >1/100)—the aspect ratio being equal to the ratio between: the diameter or the surface of the hole 134'; and the length or the surface of the cavity. For this reason, the thickness of the conductive layer deposited through a hole 134' may vary along the extent of the protruding walls 111', such that said cavities may only be partially filled. For instance, in a plane perpendicular to the base surface of the conductive structure, a conductive region 121' may comprise an unfilled region (i.e. a hole) around the center of the region.

As illustrated, the inner dielectric sub-layer 132' is arranged between the conductive regions 121' and the outer dielectric structure 131'-131A'. Considering a plane perpendicular to the base surface of the conductive structure, the conductive regions 121' are encapsulated by (and in contact with) the inner dielectric sub-layer 132'; and the inner dielectric sub-layer 132' is encapsulated by (and in contact with) the outer dielectric structure 131'-131A'.

Preferably, the permittivity of the inner dielectric sub-layer 132' is greater than the permittivity of the outer dielectric structure 131'-131A'. For example, aluminum oxide (i.e. a high-K material) can be used for the inner dielectric sub-layer 132' and silicon oxide (i.e. a low-K material) can be used for the outer dielectric structure 131'-131A'. In this embodiment, the top electrode 120' is only in contact with the inner dielectric sub-layer 132' (e.g. a high-K material). Thereby, this embodiment allows reducing the magnitude of the electrostatic field within the capacitive structure and, more particularly, reducing the concentration of the electrostatic field in the vicinity of the geometrical singularities (corners, edges) of the top electrode 120'.

In the latter embodiment, the reduced electrostatic field concentration follows from the division of the electrostatic field between the low-K and high-K sub-layers in a bilayer dielectric. Indeed, the magnitude of the electrostatic field in the high-K sub-layer is lower than in the low-K sub-layer. Therefore, in the vicinity of the geometrical singularities of the top electrode 120', the concentration of the electrostatic field is lower in the inner dielectric sub-layer 132' (in contact with top electrode 120') than in the outer dielectric structure 131'-131A' (in contact with inner dielectric sub-layer 132'). A higher breakdown field and improved reliability follow as a result.

Here, the metal layer 140' (electrically) interconnects a plurality of conductive regions 121' so as to form the top electrode 120' (in a manner not visible on the figure for the sake of simplicity).

At this stage, the electrical device 100' is obtained and includes a capacitor formed by the bottom 110' and top 120' electrodes separated by the dielectric region 130'.

Regarding the comparison between the electrical device 100 represented in FIG. 3 and the electrical device 100' represented in FIG. 4, the following points should be noted.

The electrical device 100' presents a rounding of the corners and edges of the top electrode 120' (in a manner not visible on the figure for the sake of simplicity) which follows from the deposition sequence. Indeed, the deposition of the outer dielectric structure 131'-131A' and the inner dielectric sub-layer 132' would result in a rounding of edges and corners of the cavities. This allows reducing the magnitude of the electrostatic field within the capacitive structure.

Furthermore, the electrical device 100' may be obtained in fewer manufacturing steps than the electrical device 100. As previously discussed, the electrical device 100 may require etching the top electrode 120 such that the conductive regions 121 lies below the protruding walls 111, whereas the electrical device 100' provides by construction a top electrode 120' below the protruding walls 111'. However, the deposition of the top electrode 120' in the electrical device 100' may require a deposition technique compatible with high aspect ratios such as LPCVD or ALD.

Figure 5:
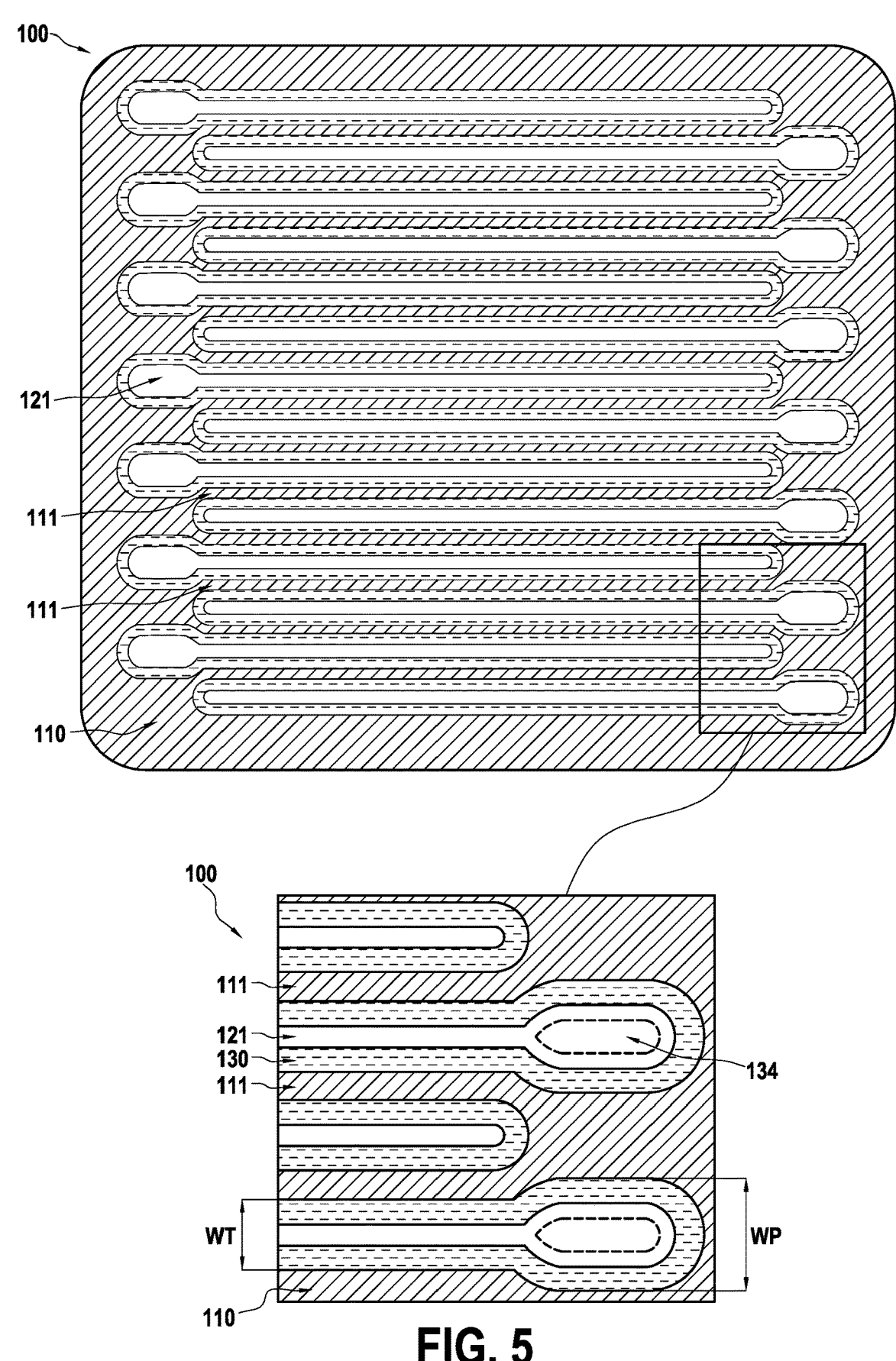
FIG. 5 illustrates a top cross-section view of an electrical device according to embodiments of the invention.

FIG. 5 illustrates a top cross-section view of an electrical device according to embodiments of the invention. More specifically, FIG. 5 depicts an electrical device 100 according to embodiments of the invention wherein the protruding walls 111 of the conductive structure 110 form trenches.

In this embodiment, the bottom electrode 110 comprises the protruding walls 111 defining the trenches and the top electrode 120 comprises the conductive regions 121 respectively arranged in the trenches, the electrodes 110 and 120 being separated by the dielectric region 130.

For example, for each trench, a conductive region 121 is arranged between the facing protruding walls 111 forming the trench and is separated from these protruding walls 111 by the dielectric region 130.

Here, contact ports are provided to electrically contact together the conductive regions 121 arranged in the trenches and surrounded by the dielectric region 130. Considering one of the trenches, the dielectric region 130 can comprise a hole 134 opening onto a portion of the conductive region 121 and the hole 134 is filled with a conductive material so as to form a contact with the conductive region 121.

For example, the contact ports are used to electrically interconnect a plurality of conductive regions 121 so as to form the top electrode 120. For instance, a metal layer extending on and above a plurality of contact ports may be used to interconnect a plurality of conductive regions 121 (for example a back-end interconnection layer).

In the embodiment illustrated by FIG. 5, the distance WP between facing protruding walls 111 for the portion of the trench comprising the contact port (i.e. at the level of the hole 134) is larger than the distance WT between facing protruding walls 111 for the remaining portion of the trench.

In other words, the portion of the trenches with the contact port is widened in comparison to the remaining portion of the trench. It allows using a large thickness of dielectric around the contact port (i.e. around the hole 134 filled with conductive material) and, thereby, maintaining a low-magnitude electrostatic field around the contact port.

Preferably, the length of the widened portion of the trench (i.e. comprising the contact port at the level of the hole 134) is shorter than the remaining portion of the trench.

Preferably, considering one of the trenches, a contact port is provided at least on one end of the trench.

More specifically, as shown in FIG. 5, the contact ports are provided at the ends of the trenches such that the contact ports of adjacent trenches are respectively located at opposite ends of the trenches. This allows a dense (staggered) disposition of the trenches and, thereby, using a large number of trenches within the electrical device 100. A high capacitance density of the electrical device follows as a result.

Figure 6:
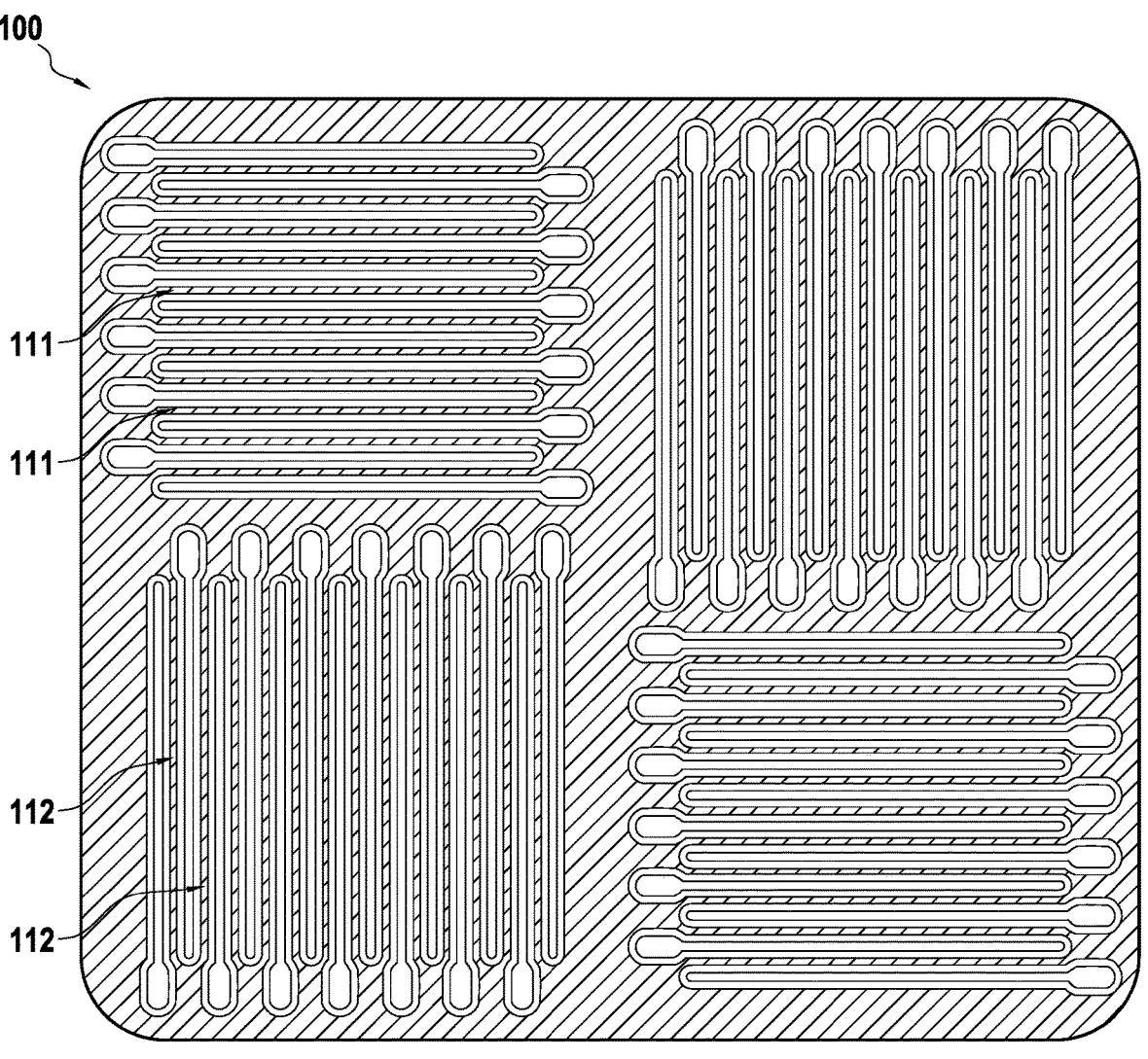
FIG. 6 illustrates a top cross-section view of an electrical device according to embodiments of the invention.

FIG. 6 illustrates a top cross-section view of an electrical device according to an embodiment of the invention.

As illustrated by FIG. 6, the conductive structure 110 comprises protruding walls 111-112 forming trenches arranged in different directions for reducing the mechanical stress.

The conductive structure 110 can include a plurality of wall regions comprises respectively multiple protruding walls 111-112. The protruding walls 111-112 forming a wall region may extend along either a first direction or a second direction of the conductive structure. In other embodiments, more than two directions may be used.

For example, as shown in FIG. 6, the conductive structure 110 comprises first protruding walls 111 extending along a first direction and second protruding walls 112 extending along a second direction, the first direction and second directions forming a defined angle with each other. The defined angle may be selected or adjusted to reduce mechanical stress within the structure. By way of example, the first direction may be substantially perpendicular to the second direction. However, embodiments are not limited to this implementation and other angle relationships (e.g. 10, 20, 30, 60, or 120 degrees) between the first direction and the second direction may be used.

Wall regions comprising protruding walls 111 can be arranged along the first direction and wall regions comprising protruding walls 112 arranged along the second direction are arranged symmetrically to reduce mechanical stress along the first and second directions. A wall region comprising protruding walls 111 arranged along the first direction is surrounded along its sides by walls region comprising protruding walls 112 arranged along the second direction, and vice versa.

The invention claimed is:

1. An electrical device comprising:
   a capacitor including:
      a bottom electrode comprising a conductive structure, the conductive structure comprising a base surface and facing protruding walls extending upwards from the base surface and having a highest surface;
      a top electrode comprising at least one conductive region arranged between the facing protruding walls and having a top surface, wherein the top surface of said at least one conductive region lies below or at the level of the highest surface of the protruding walls; and
      a dielectric region extending conformally over the bottom electrode and surrounding the top electrode, said capacitor being formed by the bottom and top electrodes separated by the dielectric region.

2. The electrical device of claim 1, wherein the dielectric region comprises:

a bottom dielectric layer extending conformally over the protruding walls, said at least one conductive region being arranged on the bottom dielectric layer; and a top dielectric layer on the bottom dielectric layer and on the top surface of said at least one conductive region.

3. The electrical device of claim 2, wherein the bottom dielectric layer comprises:

an oxide sub-layer on the conductive structure; and a dielectric sub-layer on the oxide sub-layer, the permittivity of the dielectric sub-layer being different from the permittivity of the oxide sub-layer.

4. The electrical device of claim 1, wherein the dielectric region comprises:

an outer dielectric structure surrounding said at least one conductive region and comprising:

a bottom dielectric sub-layer extending conformally over the protruding walls; and a ceiling dielectric sub-layer, said at least one conductive region being arranged inside a region defined by the bottom and ceiling dielectric sub-layers; and a top dielectric layer on and above the outer dielectric structure.

5. The electrical device of claim 4, wherein the bottom dielectric sub-layer is an oxide sub-layer on the conductive structure, and an inner dielectric sub-layer is arranged between the outer dielectric structure and said at least one conductive region, the permittivity of the inner dielectric sub-layer being different from the permittivity of the bottom dielectric sub-layer.

6. The electrical device of claim 1, wherein the dielectric region comprises a hole opening onto a portion of said at least one conductive region, said hole being filled with a conductive material so as to form a contact with said at least one conductive region.

7. The electrical device of claim 6, wherein a distance between facing protruding walls at the level of said hole opening onto said portion of said at least one conductive region is larger than a distance between facing protruding walls at the level of another portion of said at least one conductive region surrounded by the dielectric region.

8. The electrical device of claim 1, wherein corners of protruding walls are rounded, a curvature radius of the rounded corners being less than a thickness of the dielectric region.

9. The electrical device of claim 1, wherein the conductive structure comprises first protruding walls extending along a first direction and second protruding walls extending along a second direction, wherein the second direction differs from the first direction.

10. A method for obtaining an electrical device comprising a capacitor, said method comprising:

forming a conductive structure so as to obtain a bottom electrode, the conductive structure comprising a base surface and facing protruding walls extending upwards from the base surface and having a highest surface;

forming at least one conductive region so as to obtain a top electrode, said at least one conductive region being arranged between the facing protruding walls and having a top surface, wherein the top surface of said at least one conductive region lies below or at the level of the highest surface of the protruding walls; and forming a dielectric region extending conformally over the protruding walls and surrounding said at least one conductive region.

11. The method of claim 10, wherein forming the dielectric region comprises:

forming a bottom dielectric layer extending conformally over the protruding walls, said at least one conductive region being formed on the bottom dielectric layer; and forming a top dielectric layer on the bottom dielectric layer and on the top surface of said at least one conductive region.

12. The method of claim 10, wherein forming the dielectric region comprises:

forming an outer dielectric structure comprising:

a bottom dielectric sub-layer extending conformally over the protruding walls; and a ceiling dielectric sub-layer; and forming a top dielectric layer on and above the outer dielectric structure, wherein the outer dielectric structure surrounds said at least one conductive region, said at least one conductive region being arranged inside a region defined by the bottom and ceiling dielectric sub-layers.

13. The method of claim 10, further comprising:

etching the dielectric region so as to obtain a hole opening onto a portion of said at least one conductive region; and filling said hole with a conductive material so as to form a contact with said at least one conductive region.

14. The method of claim 10, further comprising: rounding corners of protruding walls, a curvature radius of said rounded corners being less than a thickness of the dielectric region.

15. The method of claim 10, further comprising: interconnecting a plurality of conductive regions so as to form the top electrode.

\* \* \* \* \*